United States Patent
Haim et al.

(10) Patent No.: US 11,748,285 B1
(45) Date of Patent: Sep. 5, 2023

(54) TRANSACTION ORDERING MANAGEMENT

(71) Applicant: Amazon Technologies, Inc., Reno, NV (US)

(72) Inventors: Roi Ben Haim, Netanya (IL); Guy Nakibly, Kdumin (IL); Adi Habusha, Aloneyaba (IL); Simaan Bahouth, Shfaram (IL)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 16/452,233

(22) Filed: Jun. 25, 2019

(51) Int. Cl.
G06F 13/38 (2006.01)
G06F 9/455 (2018.01)
G11C 7/10 (2006.01)
H04L 69/22 (2022.01)

(52) U.S. Cl.
CPC .......... *G06F 13/387* (2013.01); *G06F 9/45533* (2013.01); *G11C 7/1006* (2013.01); *H04L 69/22* (2013.01); *G06F 2213/0026* (2013.01)

(58) Field of Classification Search
CPC ... G06F 13/387; G06F 9/45533; G11C 7/1006; H04L 69/22; G06F 2213/0026
See application file for complete search history.

(56) References Cited

U.S. PATENT DOCUMENTS

| | | | |
|---|---|---|---|
| 6,324,178 B1* | 11/2001 | Lo et al. ............... | H04L 29/06 370/392 |
| 7,613,850 B1* | 11/2009 | Doering et al. ...... | G06F 13/1621 710/36 |
| 9,258,271 B1* | 2/2016 | Anderson ............ | H04L 61/255 |
| 9,483,290 B1* | 11/2016 | Mantri et al. ........ | G06F 9/45558 |
| 9,489,304 B1* | 11/2016 | Swarbrick et al. ..... | G06F 13/00 |
| 9,928,207 B1* | 3/2018 | Habusha et al. .... | G06F 13/4282 |
| 2005/0289306 A1* | 12/2005 | Muthrasanallur et al. .................. | G06F 13/1626 711/158 |
| 2010/0303079 A1* | 12/2010 | Singhal et al. ....... | G06F 13/385 370/394 |
| 2017/0010916 A1* | 1/2017 | Singh et al. ............ | G06F 9/50 |

* cited by examiner

*Primary Examiner* — Idriss N Alrobaye
*Assistant Examiner* — Dayton Lewis-Taylor
(74) *Attorney, Agent, or Firm* — Hogan Lovells US LLP

(57) ABSTRACT

Ordering rules, such as those enforced by the peripheral component interconnect express (PCIe) protocol for data communications, can be intelligently enforced for independent transactions. A single device might host or be associated with multiple PCIe devices, such as virtual machines, and treating requests from these separate PCIe devices as coming from separate domains enables the ordering rules to be bypassed for certain transactions. Further, since a virtual machine might host multiple applications or be associated with multiple processors that can submit independent requests, the ordering rules can be bypassed at the transaction level in at least some instances. The ability to intelligently bypass ordering rules can help to improve the performance of the overall system, as requests do not need to be unnecessarily delayed and data storage capacity can be more fully utilized.

20 Claims, 9 Drawing Sheets

TRANSACTION ORDERING MANAGEMENT

BACKGROUND

As an ever-increasing amount of data is being transmitted and processed electronically, there is a corresponding desire to improve the performance of these tasks. Various protocols are used to manage the transmission of data between source and destination locations. A protocol such as the peripheral component interconnect express (PCIe) protocol can be used, which is an interface standard for connecting high-speed components. A motherboard on a conventional computing device might include a number of PCIe slots that can be used to add PCIe compatible devices, such as graphics processing units, Wi-Fi cards, storage devices, and the like. In order to prevent a loss or corruption of data, PCIe imposes strict ordering rules on transactions moving through the PCIe fabric. For operations such as reads and writes, the ordering ensures that the completion of data transactions is deterministic and in the sequence intended by the programmer. It might be the case, however, that certain transactions do not need to comply with these ordering rules, such that the enforcement of the ordering rules on these transactions can provide unnecessary limitations that can negatively impact performance.

BRIEF DESCRIPTION OF THE DRAWINGS

Various embodiments in accordance with the present disclosure will be described with reference to the drawings, in which.

DETAILED DESCRIPTION

Approaches in accordance with various embodiments provide for the management of data transmissions and processing in a computing environment. In particular, various embodiments provide for the intelligent enforcement of ordering rules implemented on various transactions. Certain embodiments use a standard, such as the peripheral component interconnect express (PCIe) protocol, for data communications. The PCIe protocol enforces ordering rules on certain data transactions, including writes and reads from memory. The ordering rules are enforced for various requests and transactions from a single device, but a single device might host or be associated with multiple devices, such as virtual machines or processors (e.g., CPUs or GPUs). By treating requests for these independent devices as corresponding to different ordering domains, the ordering rules can be bypassed in at least certain situations. Further, since a virtual machine might host multiple applications or be associated with multiple processors that can submit independent requests, the ordering rules can be bypassed at the transaction level in at least some instances. The ability to intelligently bypass ordering rules can help to improve the performance of the overall system, as requests do not need to be unnecessarily delayed and data storage capacity can be more fully utilized.

In the description herein, various embodiments are described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described. Various other functions can be implemented within the various embodiments as well as discussed and suggested elsewhere herein.

Figure 1:
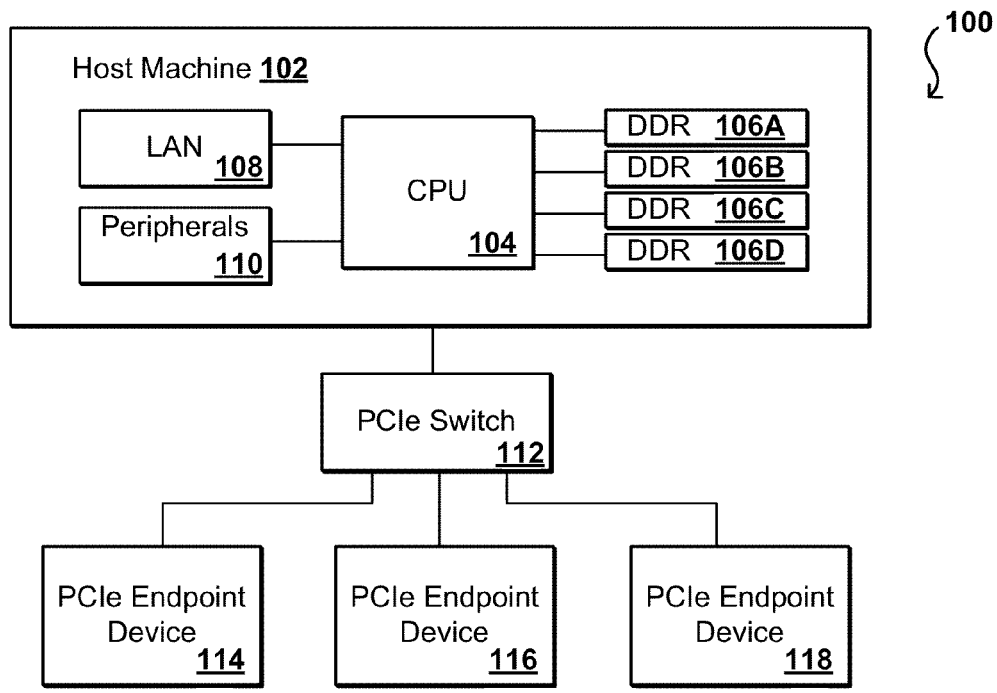
FIG. 1 illustrates components of an example computing system that can be utilized in accordance with various embodiments.

In many computer environments, there will be various components that will need to transfer data to other components, of various types and at various locations. FIG. 1 illustrates an example environment 100 in which components on a host machine 102 may communicate with other components on, or external to, the host machine 102. In order to facilitate communications between different types of components (or systems, devices, etc.), various standards can be utilized. As mentioned above, one such standard is the PCIe protocol. As with other protocols, PCIe imposes ordering rules on concurrent transactions, or transactions that are traveling through a PCIe fabric at, or around, the same time. These ordering rules help to ensure that the various transactions are completed in the proper order, to avoid data loss or corruption, deadlocks, and other such issues. For conventional PCIe, there are three types of incoming PCIe packets to be processed, including memory reads, memory writes, and read completion. Other types of packets or transactions can be utilized for the same or other protocols or standards within the scope of the various embodiments. In the present example, a PCIe device can perform actions such as to write data to, and read data from, memory (such as DDR memory 106A-D) on the host device.

The PCIe specification defines strict ordering between these types of packets to a previous write. In at least some embodiments, this means that none of the three types of packets mentioned are allowed to "pass," or be performed before completion of, a previously-queued memory write transaction. PCIe does allow for some relaxation in certain cases, such as where an ID ordering bit is set in the packet. When such a bit is set, the corresponding packets from a certain source identifier (ID) do not need to maintain ordering with previous writes from other IDs for other sources. In other embodiments a relaxed ordering bit can be set in a packet, such that memory write requests or completions do not need to maintain ordering with previous write transactions, regardless of the source ID. In order for such enhancements to be supported, an originator needs to set the relevant bit for memory writes and reads, the requestor has to set the relevant bit in the request for completions, and the completer needs to set the relevant bit in the corresponding completion packet.

It might be the case that other protocols are used to manage data transmission in a given computer system. For example, an interconnect protocol such as Advanced extensible Interface (AXI) is used by many system on chip (SoC) designers. The AXI protocol establishes rules for communications between different modules on a chip, requiring a type of handshake before a given transmission is performed in at least some instances. Such an approach provides an effective medium for transfer of data between the existing components on a chip. AXI defines two independent request channels for read and write operations, and two corresponding independent completion channels, for both read and write completion packets. There are no ordering rules between the different AXI channels, and every transaction is marked with an ID. Ordering within a channel can be enforced for transactions with the same ID by forcing the transaction packets to take the same routing path. In case a fork is needed, such as for transactions with the same ID that have different targets, the later transaction can be forced to wait until its predecessor transaction with the same ID is completed.

In one embodiment, a PCIe core approach can be used to enforce PCIe ordering across a fabric, such as an AXI fabric. This core implements strict ordering rules with no relaxation. For write operations, all write transactions are given the same AXI ID. The implication of this is that all writes have to take the same route or path through the fabric. Even for transactions to different targets that would require splitting the path, the later transaction waits until its predecessor completes its access. Since read and write packets are mapped to different AXI channels, the only way to enforce ordering between a read for a previously queued write is by letting the read make a progress only after all previous writes have completed. The read transaction therefore will need to wait for round trip completion of the whole request. Read completion transactions are handled similar to read transactions.

A PCIe ordering relaxation approach can accept writes locally and generate a completion towards the agent while issuing the request forward to the final destination. The request can be kept outstanding until it receives the final completion. Successor independent writes can receive different transaction IDs, enabling the AXI fabric to provide each write a different routing path. After receiving a completion for the predecessor write, successor reads and completions can make progress and be transmitted from the core. Each can be checked against a set of software-defined internal rules. These rules can be built using fields from the packet as described herein.

Such an approach can provide various benefits. For example, writes from different PCIe IDs, which are guaranteed to be independent in at least some embodiments, can take different routes or paths through the fabric, which can help to reduce congestion in the fabric and allow transactions to pass each other. Reads and completions can pass previously-queued independent writes. Statistically, such an approach should improve performance for read and completion performance, since in a strict ordering mode of work each of these transactions would need to wait until all previous writes had completed, or for the whole request to complete round trip, assuming writes are common enough.

Referring back to FIG. 1, PCIe can manage the way in which components of a host machine 102 communicates with other PCIe-compatible devices, which can each act as an endpoint for communications as illustrated by the PCIe endpoint devices 114, 116, 118. The host machine 102 can communicate through a PCIe interface in at least some embodiments, such as may include any appropriate I/O device. This can include, as mentioned, read, write, and completion transactions. The communications can utilize a bi-directional channel between the host machine 102 and a PCIe switch 112, for example, which can direct communications through a PCIe fabric to the various PCIe endpoints 114, 116, 118. Each PCIe device can include a processor and memory that can assist in transaction management, while at least some of the management can be performed on a CPU 104 of the host machine, among other such options. The CPU may use other protocols to communicate with other components as well, such as to communicate with a local area network (LAN) card 108 or various peripherals 110, etc. As mentioned, this may include a transaction such as a read transaction, which includes a request to read data and a response that includes the requested data, received over the appropriate channel.

Figure 2:
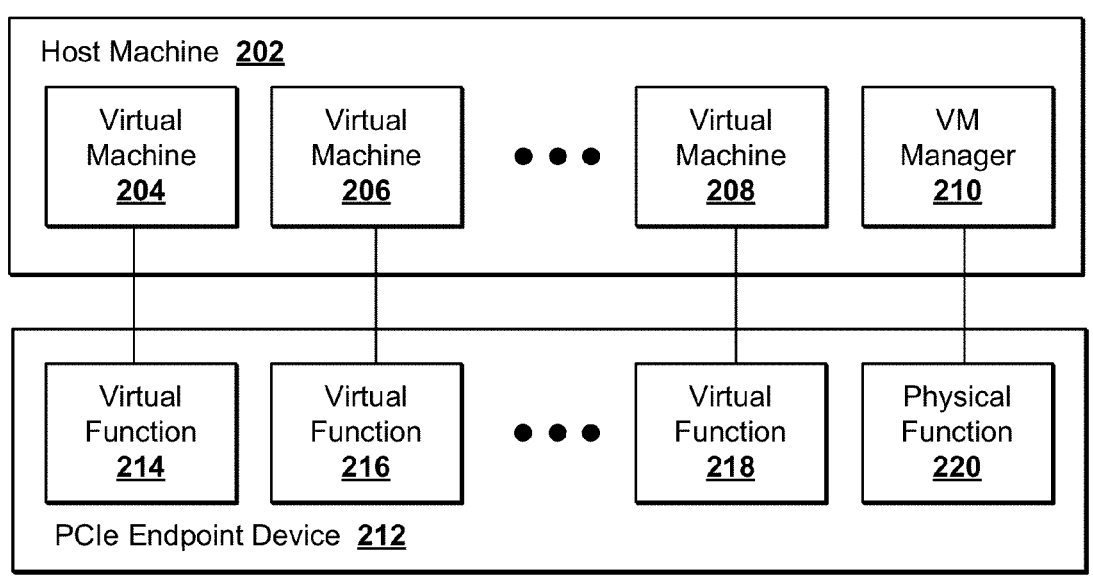
FIG. 2 illustrates components of an example computing system running a number of virtual machines that can be utilized in accordance with various embodiments.

As mentioned, strict ordering can help to ensure the integrity of data operations, but can have a negative impact on performance. In various situations, a host machine (or other PCIe device) may host multiple devices that may each perform or request such transactions. FIG. 2 illustrates an example host configuration 200 that can be utilized in accordance with various embodiments. In this example, the host machine 202 includes at least one primary processor that runs a primary operating system for the host machine 202, which can be considered to operate in a primary domain for the physical host 202. A single physical host machine 202 interacts with a single physical PCIe endpoint device 212. The host machine 202 in this example is executing a number of virtual machines 204, 206, 208, or virtual machine instances, that may each be treated as operating in a separate domain, here separate PCIe domains. The virtual machines 204, 206, 208 are operating under control of a virtual machine manager (VMM) 210 on the host machine. The virtual machines can be built upon, and bound by, a hypervisor layer in this example, and can each be in communication with a respective virtual function 214, 216, 218 on an external PCIe endpoint device 212. The virtual functions can perform specific tasks for the virtual machines, such as to transmit data for various data operations. The virtual machines can each communicate directly with the single PCIe endpoint device 212. The virtual machine manager 210 may, in turn, communicate with a physical function (PF) 220 on the PCIe endpoint device 212. The virtual machines can communicate with the PCIe endpoint device through the PCIe fabric, as may include at least one PCIe switch. The virtual machines can communicate with the virtual devices by writing a descriptor to device memory and get back one or more completions. The descriptor is a description of a job to be done by the I/O device, such as sending a packet or reading from an external disk. Even though the transactions are all coming from a single host machine 202, the PCIe endpoint device in a virtual environment can function as separate PCIe devices for purposes of independent PCIe communications. In this regard, strict ordering of transactions may not be required for at least some of the transactions. As mentioned, however, conventional approaches for processing packets and managing ordering would cause ordering to be enforced for many of these virtual machines. Various other types of endpoints or PCIe devices may have similar aspects as discussed and suggested herein. This can lead to an unnecessary degradation in performance of the overall system.

Approaches in accordance with various embodiments can attempt to treat these virtual functions as separate virtual PCIe endpoints or virtual devices in at least some situations, such that ordering is not enforced for transactions from independent virtual devices. Further, ordering limitations that a read cannot bypass a write transaction do not need to be enforced if the read access is to a location to which data is not currently being written. Approaches can therefore attempt to determine when ordering does not need to be enforced, and can generate or update the packets in order to help guide whether the ordering rules need to be enforced.

In the example of FIG. 2, each virtual function is assigned to a separate ordering domain, which can each be associated with a respective PCIe identifier ("PCI ID"). In this way, each virtual function can be treated as a separate virtual PCIe device even though they are all running on a single device in this example. Requests or transactions coming from different virtual functions will be associated with different PCI_ID values, such that it can be determined that the sources are unrelated and at least some of the ordering rules do not need to be enforced. For example, write requests associated with different PCI_ID values do not need to have ordering enforced, similar with completions with respect to write transactions. In some embodiments ordering may be relaxed even for the same PCIe device, since some applications allow completions to bypass writes.

In at least some embodiments, a configurable model can be used to determine whether to enforce ordering for a specific transaction. The model can execute, or be utilized, in any appropriate location, such as on a processor of a host machine, a processor of a PCIe device, or another such location. Information from a received packet can be analyzed and compared against the model to determine whether to enforce or allow bypassing of the ordering rules. The information from the packet can include, for example, the source address and source PCI_ID, as well as the destination address and destination PCI_ID. This can help to determine whether there is another pending transaction associated with the same source or destination PCIe endpoint or path, for purposes of determining whether to enforce ordering. Information for all pending transactions can be stored for comparison and enforcement analysis. If ordering is to be enforced then the process can determine whether to allow the transaction to continue to pause the transaction, such as to a transaction queue, until the appropriate release criteria are satisfied, such as a prior write for that PCI_ID completing, etc. As mentioned, enforcement of ordering rules can be optimized for specific customers, applications, or devices, among other such options. This can include, for example, relaxing the rules or providing for an acceleration of processing as discussed and suggested herein. A PCIe point of serialization block, for example, can divide a stream into multiple sub-streams that can each have their own ordering, which can be implemented in some embodiments using a dynamically linked list. Such a block can be used in some embodiments for any application that divides a stream into multiple sub-streams.

Figure 3:
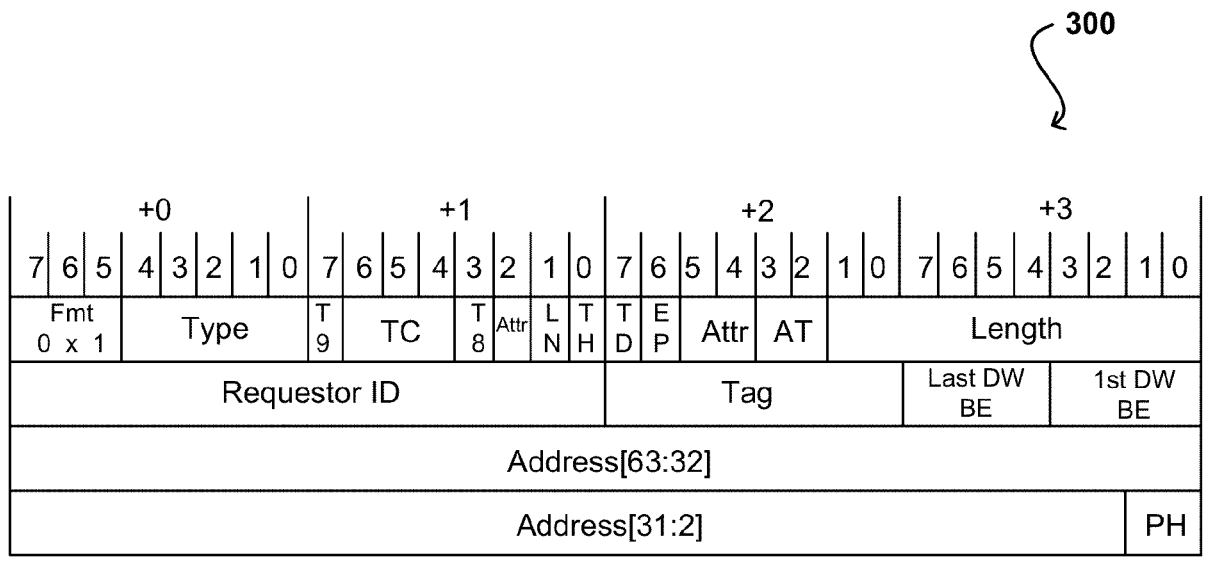
FIG. 3 illustrates an example PCIe request header that can be utilized in accordance with various embodiments.

FIG. 3 illustrates example request header 300 for addressing of memory according to the PCIe standard. As illustrated, the request header 300 includes a number of fields that can be used by a host CPU scanning a PCIe bus to detect the presence of a PCIe device. A Requestor ID field can identify the source of the packet, while other fields provide information about the type, length, attributes, and other aspects of the packet. In one embodiment, information can be extracted from such a PCIe packet to determine whether to accelerate the packet and/or enforce ordering. In one embodiment, this information includes the requestor identifier, or the PCI_ID of the originator of the transaction, which can be relevant for memory requests including both reads and writes. The information to be extracted can also include a completer identifier, such as the PCI_ID of the completer of the transaction, which can be relevant for completions. Other information can be extracted as well, as may include a steering tag, a target memory address, a relaxed ordering attribute, and an ID ordering attribute, among other such options.

As mentioned, the ordering domain for a device can be divided into many different sub-ordering domains for independent PCIe devices, which can be assigned different PCI_IDs. The packet header for each packet on a transaction will include the relevant PCI_ID at least for purposes of determining ordering enforcement. Each sub-domain can be treated as a separate, independent PCIe domain, even if they are hosted on, or otherwise associated with, a single PCIe device, such as a host machine. In some embodiments, the ordering model will be used to determine an order control parameter value. The order control can indicate which ordering rules are to be applied for a specific transaction, as determined on a transaction-by-transaction basis. In some embodiments the order control can indicate that the transaction only has to have ordering enforced for other transactions on its specific ordering domain.

In some embodiments a value such as a flush type can be used to indicate how ordering is to be enforced for a particular transaction. As mentioned, an internal protocol such as AXI may be used within a network device. AXI has a write channel and a read channel that are independent. AXI can enforce ordering between transactions within the same channel, using a field such as "transaction_ID" in the AXI channel. A value such as a flush type value can be used to indicate whether to enforce ordering by memory writes in the same ordering domain, as it may be desirable in some situations to ensure that the memory writes are performed in order. A flush type can be used to indicate how ordering is to be enforced for a transaction, such as to specify an ordering enforcement method to be used. This can be enforced by letting the transaction wait for all the previous transactions within its ordering domain to complete. In some embodiments this can be enforced by setting a transaction identifer to the same value as the previous transaction from that same ordering domain, which indicates that writes are part of a common transaction and thus need to be written in order. The information extracted from a packet header can then be used to determine the PCI ID, the ordering requirement for the packet, and the way in which the ordering requirement is to be enforced for the packet. The enforcement system can then enforce ordering rules based at least in part upon this information as discussed and suggested herein. As mentioned, however, the model is configurable such that any relevant infomaiton can be included in, and extracted from, a packet on a transaction.

In at least some embodiments the PCIe transaction is converted to AXI. The model receives the PCIe transaction and converts PCIe packets for the transaction to an AXI transaction, which is then passed to the relevant target. In at least some embodiments there will be a PCI to AXI bridge to facilitate the communication, where the destination may be on the corresponding chip. So if there is a server with a processor and a PCIe card, and the PCIe card has a processor, then the block (or other grouping of logic) might execute in both the host processor and the PCIe card. The block can also execute in a storage device or network device, among other such options, with the ordering rules in at least some embodiments being stored in firmware.

Figure 4:
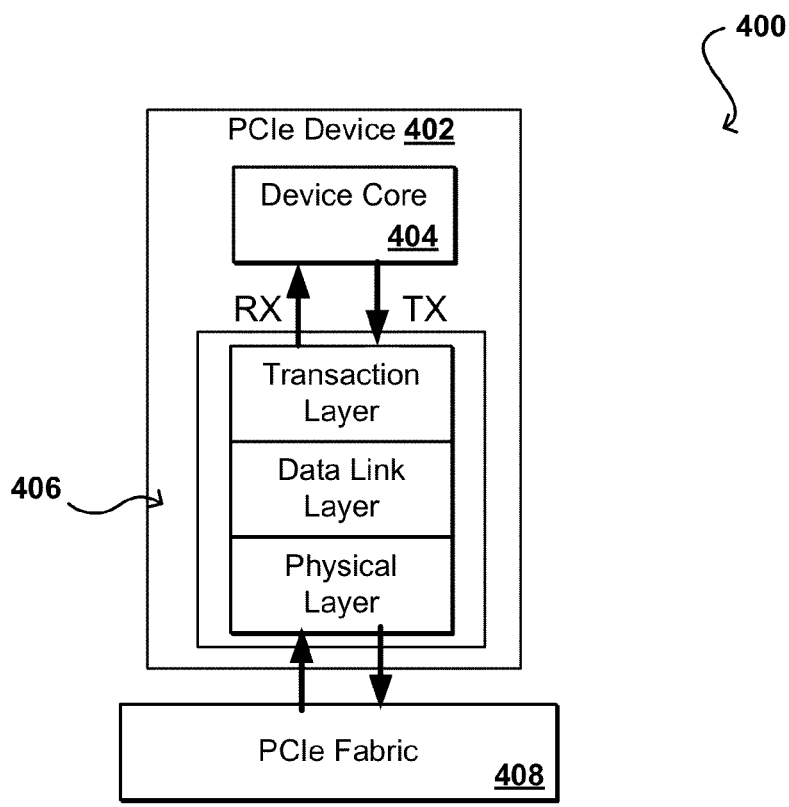
FIG. 4 illustrates components of an example PCIe device that can be utilized in accordance with various embodiments.

FIG. 4 illustrates an example PCIe device configuration 400 that can be utilized in accordance with various embodiments, where the endpoint can correspond to a specific PCIe device 402. In order to read data in some embodiments, a processor can issue a load register command from the same memory-mapped location in the endpoint. A memory read packet can be generated with the same memory-mapped address and header information. The packet can propagate through the PCIe fabric to the endpoint. Routing can be based on the address in the header as discussed herein. Once the endpoint receives the memory read packet, a completion with data packet can be generated, with a header that includes the identifier used to rout the packet through the fabric, and in turn updates the targeted CPU register and terminates the transaction. FIG. 4 illustrates a layered structure 406 of an example PCIe endpoint device, which can include a transaction layer, data link layer, and physical layer used to transmit data to, and receive data from, the device core 404 in this example.

As mentioned, optimization can be performed that is specific to a customer or an application. In at least some embodiments hints can be hidden in special fields in the PCIe packets that indicate how to further relax ordering for a specific transaction. In a primary approach in some embodiments, ordering is only enforced on writes if they are associated with the same domain or PCI_ID, such as may correspond to a given virtual machine. It might be the case, however, that a virtual machine has several processors running on top of it that operate independently. The hint information can be used to indicate whether to enforce ordering on writes from the various processors for the same ordering domain, which enables enforcement to be even more relaxed. A PCIe switch in the fabric can also make routing decisions that may impact the enforcement in at least some embodiments, such as where each component has a read channel and a write channel.

Figure 5A:
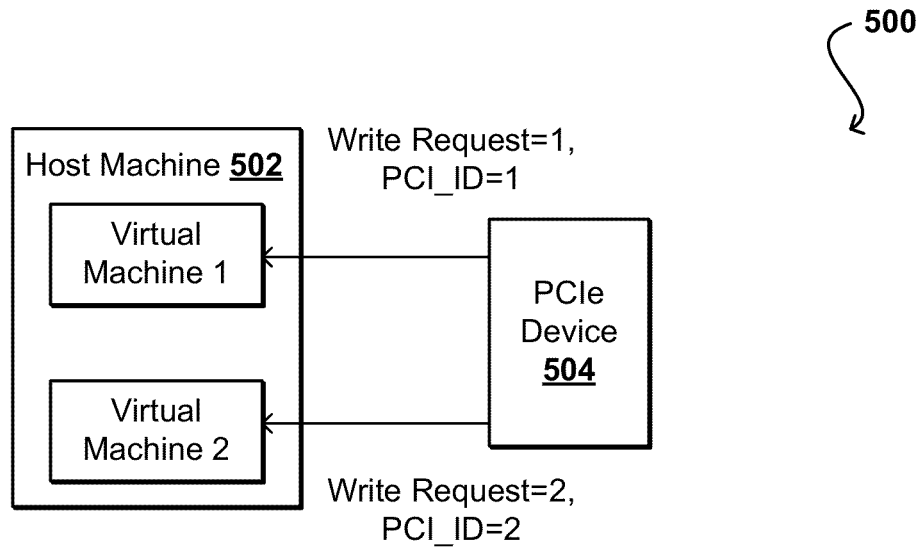
FIGS. 5A and 5B illustrate example transactions that can be managed using various embodiments.
Figure 5B:
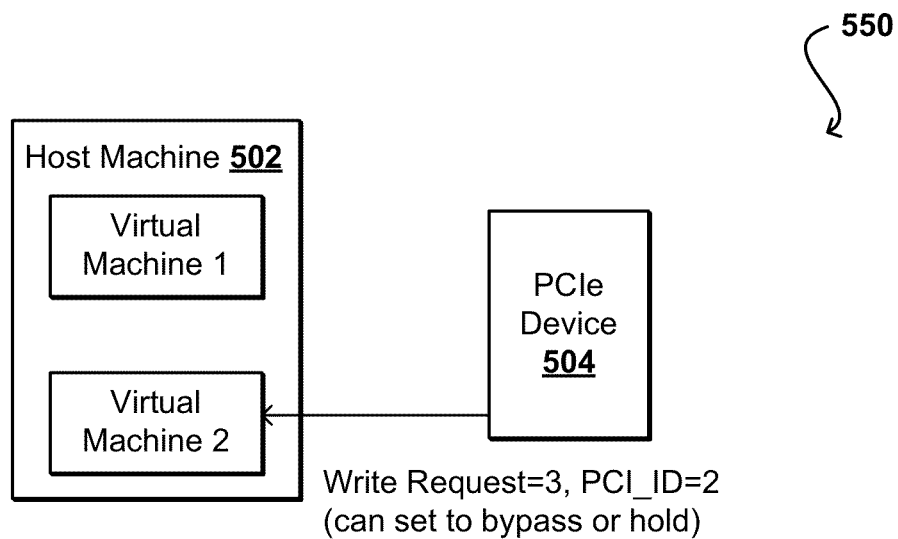

FIGS. 5A and 5B illustrate a set of requests or transactions that can be performed in accordance with various embodiments. In the example situation 500 of FIG. 5A, there are two virtual machines executing on a host machine 502 that receive communications from a single external PCIe device 504. Since the virtual machines are both communicating with the same PCIe device they would be subject to ordering enforcement in conventional approaches, but in this example each is communicating with a virtual PCIe device on the physical PCIe device 504, with each virtual function being associated with a specific sub-domain or PCI_ID. In this example, each virtual machine receives a write request from a virtual PCIe device of the physical PCIe device 504 or single external PCIe endpoint. Since the physical host acts as a single PCIe device with a single requestor ID, the PCIe device cannot determine (without more) that the requests are for different virtual machines. Since the virtual machines are associated with different virtual PCIe devices, as indicated by the PCI_ID values, ordering will not be enforced because the writes are associated with different source devices. In the example situation 550 of FIG. 5B, the second virtual machine receives a successor write request from a second virtual PCIe device. Since this request has the same PCI_ID value as pending write request 2, ordering would be enforced for the transaction. In this example, however, a packet can indicate to bypass ordering enforcement for this transaction. If ordering is to be enforced, then ordering information can indicate to enforce ordering for this transaction. Various other options for enforcing or relaxing ordering can be used as well as discussed and suggested herein.

Figure 6:
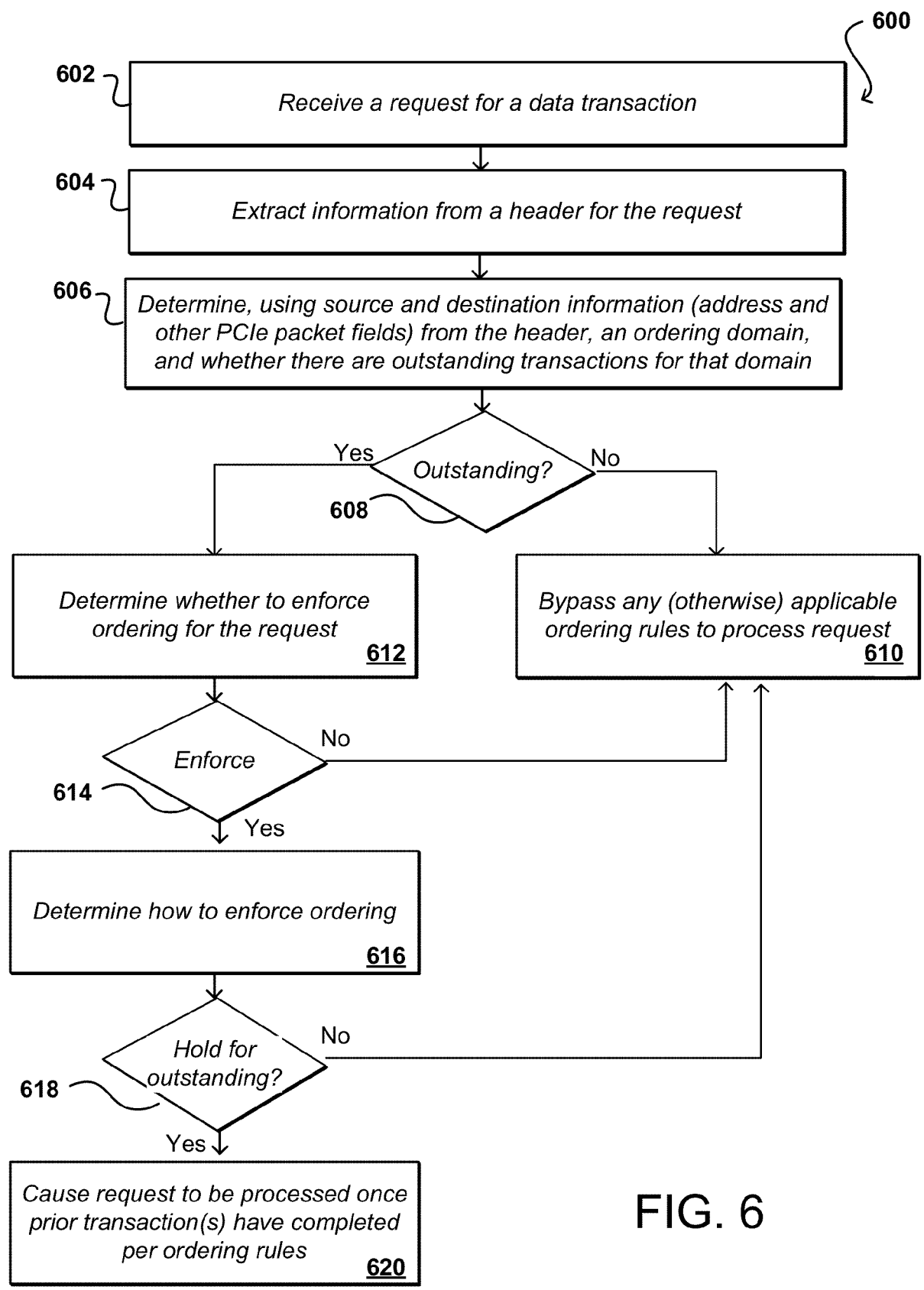
FIG. 6 illustrates an example process for managing transactions that can be utilized in accordance with various embodiments.

FIG. 6 illustrates an example process 600 for enforcing ordering rules on data transactions that can be utilized in accordance with various embodiments. It should be understood for this and other processes discussed herein that there can be additional, alternative, or fewer steps performed in similar or alternative orders, or in parallel, within the scope of the various embodiments unless otherwise stated. Further, although PCIe operations are used as an example, it should be understood that various other types of operations or functionality can benefit from aspects of the various embodiments as well, as would be apparent to one of ordinary skill in the art in light of the teachings and suggestions contained herein. In this example, a request is received 602 for a data transaction. This can be, for example, a read, write, or completion request received from a PCIe device or endpoint using a PCIe protocol, among other such options discussed and suggested herein. Information can be extracted 604 from a header for the request, such as from a PCIe packet header. The extracted information can include, for example, information for a source and destination of the request, where the information can include both address and domain information. As mentioned, independent PCIe endpoints corresponding to a PCIe device may have different domains, or sub-domains assigned, as indicated by their respective PCI_IDs. A block or switch using a relevant model can then determine 606, using at least some of this extracted information, an ordering domain for the request, as well as whether there is an outstanding transaction for that ordering domain. If it is determined 608 that there is no such outstanding request or transaction for that ordering domain, then any otherwise applicable ordering rules can be bypassed 610 and the request processed. Other applicable rules might apply where there is another request from an endpoint on the same device, which would otherwise have ordering enforced, but for the different sub-domain determination.

If there is an outstanding transaction for the determined ordering domain, another determination can be made 612 as to whether ordering is to be enforced for the request. If it is determined 614 that ordering is not to be enforced, then any applicable ordering rules can be bypassed as discussed above. If ordering is to be enforced, a determination can be made 616 as to how to enforce ordering for this operation. As mentioned, there may be multiple applications, virtual machines, virtual functions, or processors for a given endpoint, or an application may support independent operations, such that ordering can be bypassed in various situations, and the enforcement indicated through selection of a transaction for the packet. If it is determined 618 that the operation should be treated as corresponding to the same transaction and should be held, then the request can be caused 620 to be processed only after any prior, or predecessor, requests or operations are completed per the applicable ordering rules. If the request is not to be held for a pending transaction, then the operation can be treated as part of a separate transaction, such that any otherwise applicable ordering rules can be bypassed and the request processed as appropriate. As mentioned, information for all pending transactions can be stored for comparison and enforcement analysis. Also as mentioned, enforcement of ordering rules can be optimized for specific customers, applications, or devices, among other such options. This can include, for example, relaxing the rules or providing for an acceleration of processing as discussed and suggested herein. A PCIe point of serialization block, for example, can divide a stream into multiple sub-streams that can each have their own ordering, which can be implemented in some embodiments using a dynamically linked list. Such a block can be used in some embodiments for any application that divides a stream into multiple sub-streams.

There may be various ordering rules utilized, such as the native PCIe ordering rules discussed herein. In at least some instances, PCIe transaction ordering for native devices can be summarized using a set of rules. For one, PCIe requires strong ordering of transactions, such as by performing transactions in an order in which they were issued by software, flowing through the PCIe fabric. Further, no ordering relationship exists between transactions with different endpoint assignments. Ordering rules can apply in the same way to all types of transactions, including transactions for memory, I/O, configuration, and messages.

Figure 7:
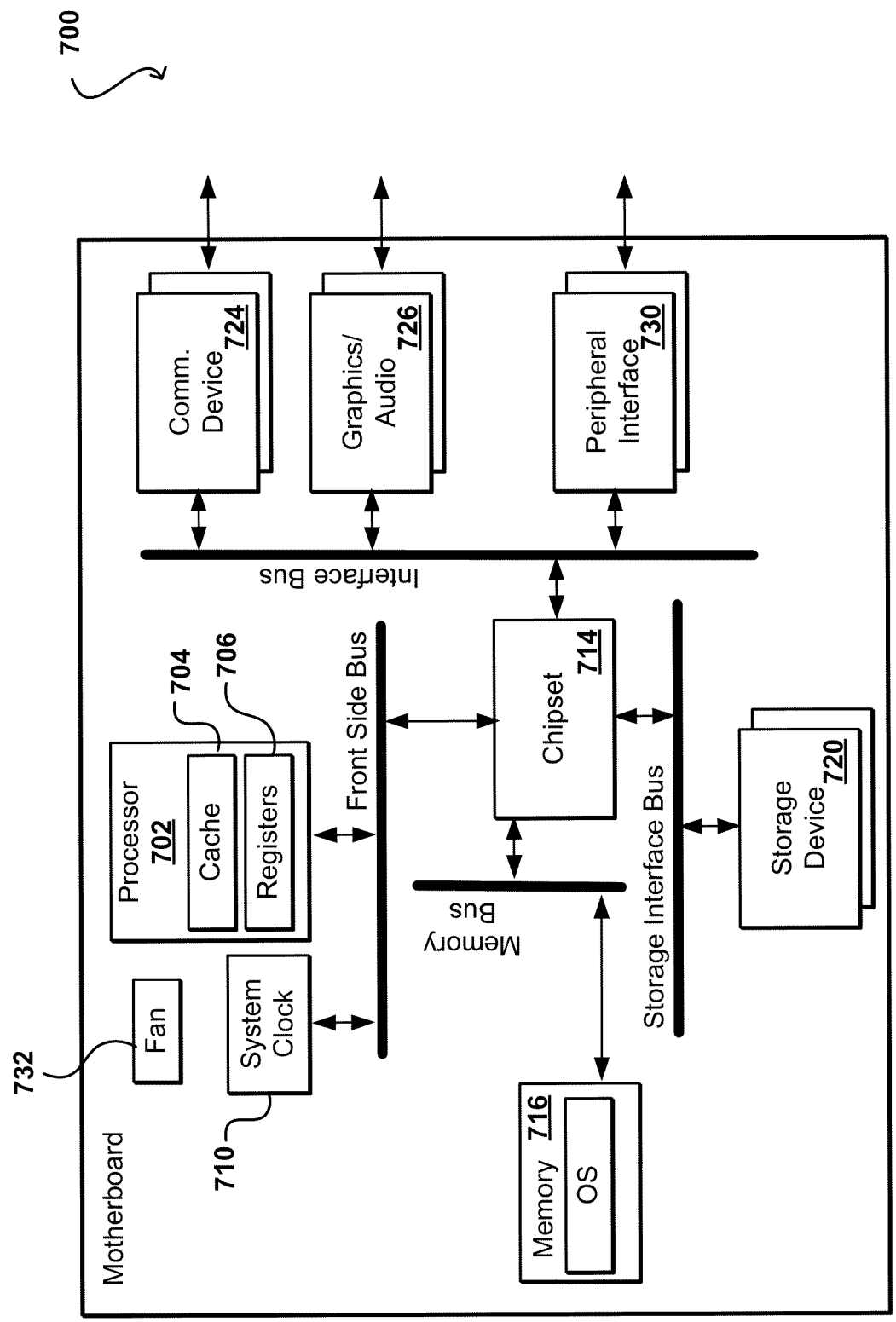
FIG. 7 illustrates components of an example computing device that can be utilized in accordance with various embodiments.

Computing resources, such as servers, that can have software and/or firmware updated in such a matter will generally include at least a set of standard components configured for general purpose operation, although various proprietary components and configurations can be used as well within the scope of the various embodiments. FIG. 7 illustrates components of an example computing device 700 that can be utilized in accordance with various embodiments. As known for computing devices, the computer will have one or more processors 702, such as central processing units (CPUs), graphics processing units (GPUs), and the like, that are electronically and/or communicatively coupled with various components using various buses, traces, and other such mechanisms. A processor 702 can include memory registers 706 and cache memory 704 for holding instructions, data, and the like. In this example, a chipset 714, which can include a northbridge and southbridge in some embodiments, can work with the various system buses to connect the processor 702 to components such as system memory 716, in the form or physical RAM or ROM, which can include the code for the operating system as well as various other instructions and data utilized for operation of the computing device. The computing device can also contain, or communicate with, one or more storage devices 720, such as hard drives, flash drives, optical storage, and the like, for persisting data and instructions similar, or in addition to, those stored in the processor and memory. The processor 702 can also communicate with various other components via the chipset 714 and an interface bus (or graphics bus, etc.), where those components can include communications devices 724 such as cellular modems or network cards, media components 726, such as graphics cards and audio components, and peripheral interfaces 730 for connecting peripheral devices, such as printers, keyboards, and the like. At least one cooling fan 732 or other such temperature regulating or reduction component can also be included as well, which can be driven by the processor or triggered by various other sensors or components on, or remote from, the device. Various other or alternative components and configurations can be utilized as well as known in the art for computing devices.

At least one processor 702 can obtain data from physical memory 716, such as a dynamic random access memory (DRAM) module, via a coherency fabric in some embodiments. It should be understood that various architectures can be utilized for such a computing device, that may include varying selections, numbers, and arguments of buses and bridges within the scope of the various embodiments. The data in memory may be managed and accessed by a memory controller, such as a DDR controller, through the coherency fabric. The data may be temporarily stored in a processor cache 704 in at least some embodiments. The computing device 700 can also support multiple I/O devices using a set of I/O controllers connected via an I/O bus. There may be I/O controllers to support respective types of I/O devices, such as a universal serial bus (USB) device, data storage (e.g., flash or disk storage), a network card, a peripheral component interconnect express (PCIe) card or interface 730, a communication device 724, a graphics or audio card 726, and a direct memory access (DMA) card, among other such options. In some embodiments, components such as the processor, controllers, and caches can be configured on a single card, board, or chip (i.e., a system-on-chip implementation), while in other embodiments at least some of the components may be located in different locations, etc.

An operating system (OS) running on the processor 702 can help to manage the various devices that may be utilized to provide input to be processed. This can include, for example, utilizing relevant device drivers to enable interaction with various I/O devices, where those devices may relate to data storage, device communications, user interfaces, and the like. The various I/O devices will typically connect via various device ports and communicate with the processor and other device components over one or more buses. There can be specific types of buses that provide for communications according to specific protocols, as may include peripheral component interconnect) PCI or small computer system interface (SCSI) communications, among other such options. Communications can occur using registers associated with the respective ports, including registers such as data-in and data-out registers. Communications can also occur using memory-mapped I/O, where a portion of the address space of a processor is mapped to a specific device, and data is written directly to, and from, that portion of the address space.

Such a device may be used, for example, as a server in a server farm or data warehouse. Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application specific integrated circuit (ASIC) comprising digital logic operable to send and receive packets.

In an illustrative embodiment, a host computing device is associated with various hardware components, software components and respective configurations that facilitate the execution of I/O requests. One such component is an I/O adapter that inputs and/or outputs data along a communication channel. In one aspect, the I/O adapter device can communicate as a standard bridge component for facilitating access between various physical and emulated components and a communication channel. In another aspect, the I/O adapter device can include embedded microprocessors to allow the I/O adapter device to execute computer executable instructions related to the implementation of management functions or the management of one or more such management functions, or to execute other computer executable instructions related to the implementation of the I/O adapter device. In some embodiments, the I/O adapter device may be implemented using multiple discrete hardware elements, such as multiple cards or other devices. A management controller can be configured in such a way to be electrically isolated from any other component in the host device other than the I/O adapter device. In some embodiments, the I/O adapter device is attached externally to the host device. In some embodiments, the I/O adapter device is internally integrated into the host device. Also in communication with the I/O adapter device may be an external communication port component for establishing communication channels between the host device and one or more network-based services or other network-attached or direct-attached computing devices. Illustratively, the external communication port component can correspond to a network switch, sometimes known as a Top of Rack ("TOR") switch. The I/O adapter device can utilize the external communication port component to maintain communication channels between one or more services and the host device, such as health check services, financial services, and the like.

The I/O adapter device can also be in communication with a Basic Input/Output System (BIOS) component. The BIOS component can include non-transitory executable code, often referred to as firmware, which can be executed by one or more processors and used to cause components of the host device to initialize and identify system devices such as the video display card, keyboard and mouse, hard disk drive, optical disc drive and other hardware. The BIOS component can also include or locate boot loader software that will be utilized to boot the host device. For example, in one embodiment, the BIOS component can include executable code that, when executed by a processor, causes the host device to attempt to locate Preboot Execution Environment (PXE) boot software. Additionally, the BIOS component can include or takes the benefit of a hardware latch that is electrically controlled by the I/O adapter device. The hardware latch can restrict access to one or more aspects of the BIOS component, such controlling modifications or configurations of the executable code maintained in the BIOS component. The BIOS component can be connected to (or in communication with) a number of additional computing device resources components, such as processors, memory, and the like. In one embodiment, such computing device resource components may be physical computing device resources in communication with other components via the communication channel. The communication channel can correspond to one or more communication buses, such as a shared bus (e.g., a front side bus, a memory bus), a point-to-point bus such as a PCI or PCI Express bus, etc., in which the components of the bare metal host device communicate. Other types of communication channels, communication media, communication buses or communication protocols (e.g., the Ethernet communication protocol) may also be utilized. Additionally, in other embodiments, one or more of the computing device resource components may be virtualized hardware components emulated by the host device. In such embodiments, the I/O adapter device can implement a management process in which a host device is configured with physical or emulated hardware components based on a variety of criteria. The computing device resource components may be in communication with the I/O adapter device via the communication channel. In addition, a communication channel may connect a PCI Express device to a CPU via a northbridge or host bridge, among other such options.

In communication with the I/O adapter device via the communication channel may be one or more controller components for managing hard drives or other forms of memory. An example of a controller component can be a SATA hard drive controller. Similar to the BIOS component, the controller components can include or take the benefit of a hardware latch that is electrically controlled by the I/O adapter device. The hardware latch can restrict access to one or more aspects of the controller component, Illustratively, the hardware latches may be controlled together or independently. For example, the I/O adapter device may selectively close a hardware latch for one or more components based on a trust level associated with a particular user. In another example, the I/O adapter device may selectively close a hardware latch for one or more components based on a trust level associated with an author or distributor of the executable code to be executed by the I/O adapter device. In a further example, the I/O adapter device may selectively close a hardware latch for one or more components based on a trust level associated with the component itself. The host device can also include additional components that are in communication with one or more of the illustrative components associated with the host device. Such components can include devices, such as one or more controllers in combination with one or more peripheral devices, such as hard disks or other storage devices. Additionally, the additional components of the host device can include another set of peripheral devices, such as Graphics Processing Units ("GPUs"). The peripheral devices and can also be associated with hardware latches for restricting access to one or more aspects of the component. As mentioned above, in one embodiment, the hardware latches may be controlled together or independently.

Figure 8:
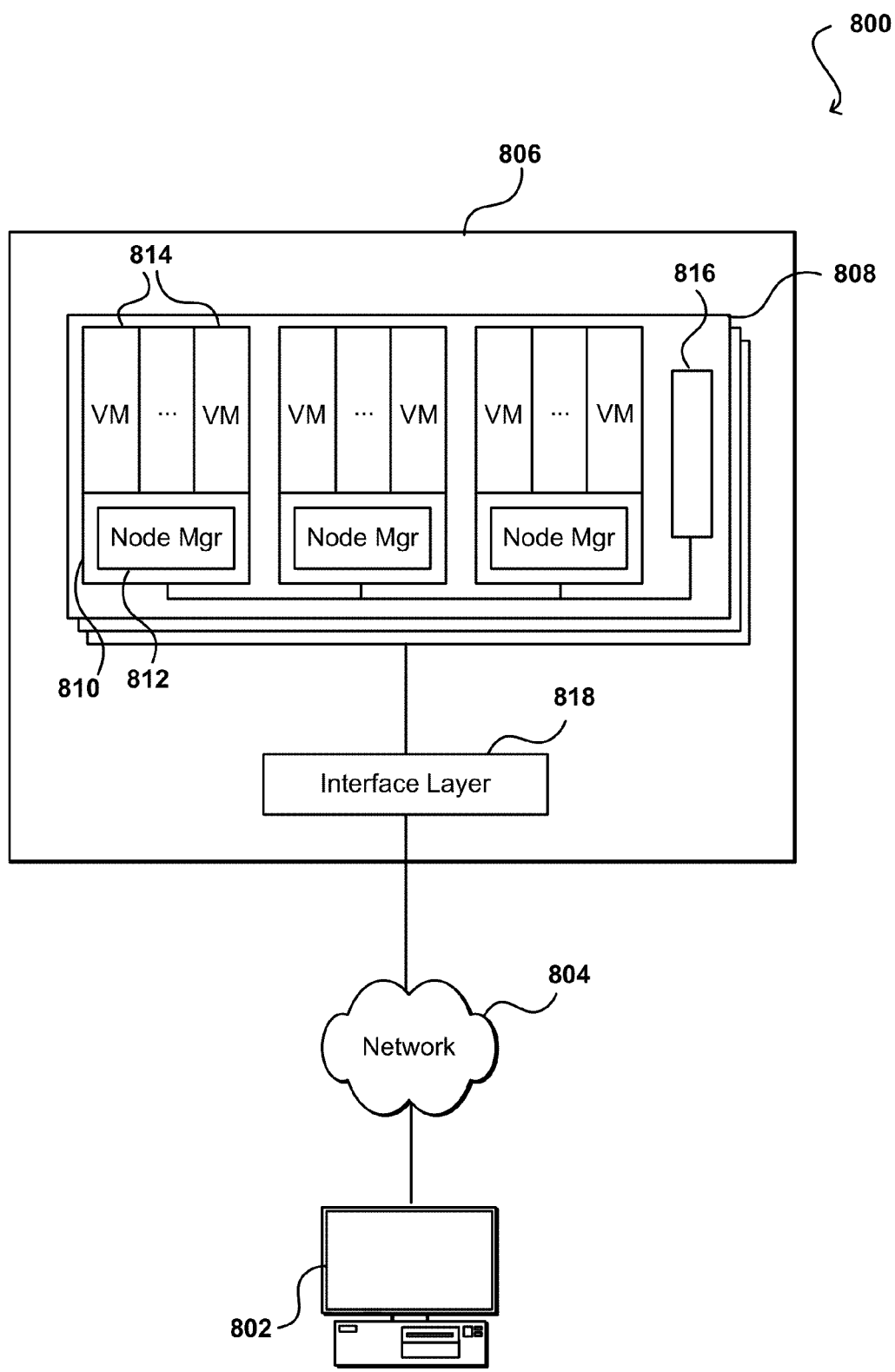
FIG. 8 illustrates components of an example environment in which aspects of the various embodiments can be implemented.

FIG. 8 illustrates an example environment 800 in which aspects of the various embodiments can be implemented. In this example, a user is able to utilize a computing device 802 to submit a call or request across at least one network 804 to be received to a shared resource environment 806, such as a data center or "cloud" environment, among other such options. The computing device 802 can include any appropriate device, as may include client devices such as personal computers, cell phones, handheld messaging devices, laptop computers, set-top boxes, personal data assistants, electronic book readers, and the like. The at least one network 804 can include any appropriate wired and/or wireless network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail.

The resource environment 806 in this example includes an interface layer 818, as may include components such as application programming interfaces (APIs), routers, switches, Web servers, and other such components known or used for routing communications from a user computing device 802 to an appropriate resource in the environment. In this example, the resource environment 806 includes a number of racks 808, each rack including a number of host computing devices 810, as well as an optional rack support computing system 816 in this example embodiment. The host computing systems 810 on one of the illustrated racks 808 each host one or more virtual machines 814 in this example, as well as a distinct virtual machine manager 812 associated with the virtual machines on that host computing system. The virtual machine manager (VMM) is tasked with managing the virtual machines (VMs) on the respective host device, and handling various aspects of virtualization.

Each virtual machine 814 can act as an independent computing resource for executing one or more tasks on behalf of a user, where the virtual machine functions as a dedicated resource for the user. The environment can also include additional host computing systems that do not include distinct virtual machines, but may nonetheless each act as a computing resource for one or more users. The rack support computing system 816 may provide various utility services for other computing systems local to its rack (e.g., long-term program storage, metering, and other monitoring of program execution and/or of non-local block data storage access performed by other computing systems local to the rack, etc.), as well as possibly to other computing systems located in the environment 806. Each computing system may also have one or more local attached storage devices (not shown), such as to store local copies of programs and/or data created by or otherwise used by the executing programs, as well as various other components.

It will be appreciated that the example of FIG. 8 has been simplified for the purposes of explanation, and that the number and organization of host computing systems and other devices may be much larger than what is depicted in FIG. 8. For example, as one illustrative embodiment, there may be approximately tens of thousands of computing systems in a cloud environment, with at least some of those computing systems being host computing systems that may each host multiple virtual machines.

Figure 9:
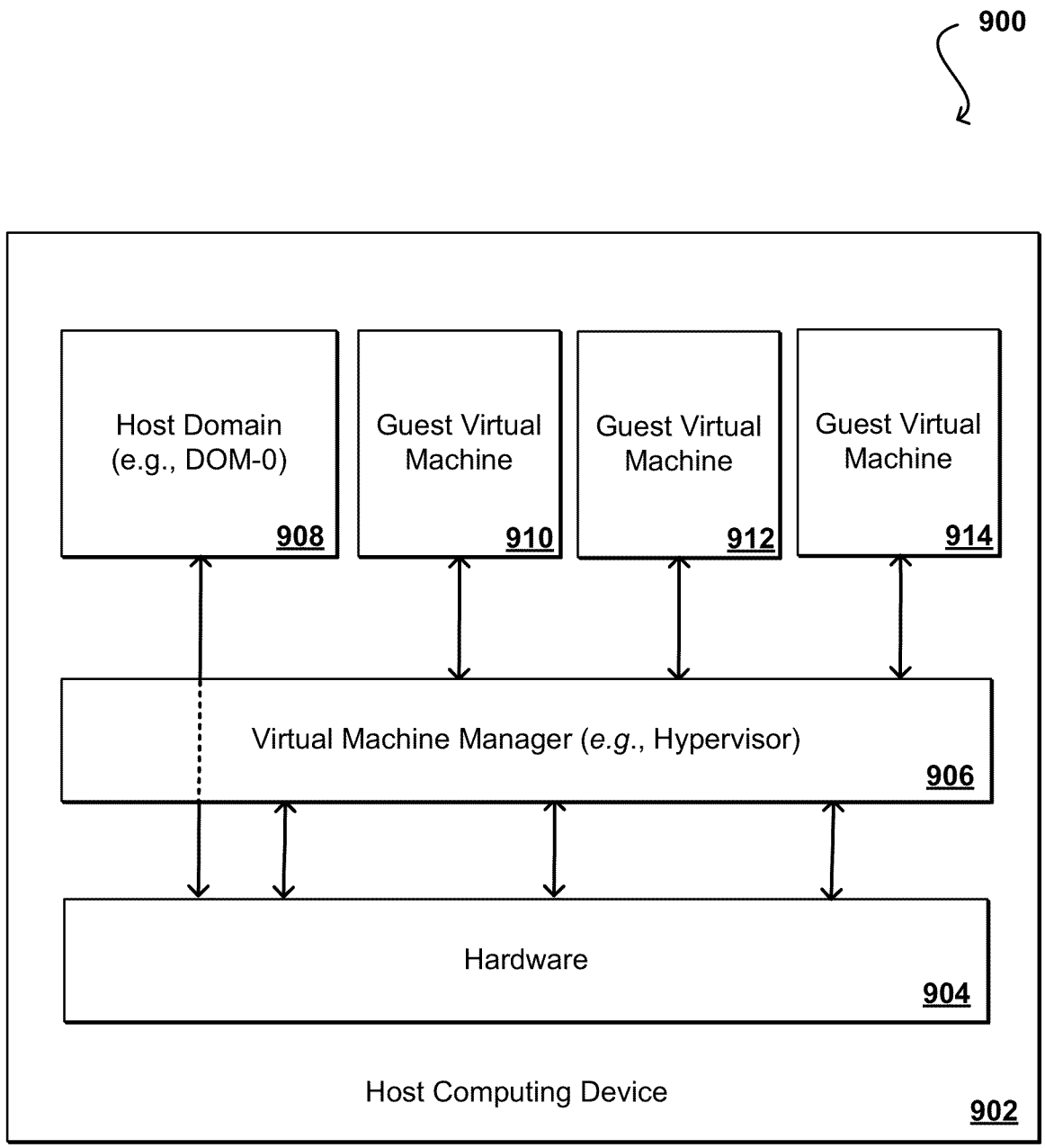
FIG. 9 illustrates components supporting virtual machines on a host device that can be utilized in accordance with various embodiments.

A number of virtualization techniques can be used to simultaneously operate a plurality of guest virtual machines (VMs) or guest operating systems (OSs) on a given host machine. FIG. 9 illustrates an example 900 of utilizing one virtualization technique using a virtual machine manager (VMM), such as a hypervisor, in accordance with various embodiments. The hardware 904 (e.g., the central processor and other such components) of the host computing device 902 is able to interface with the VMM 906 running directly on the hardware 904, such in the case of a "bare metal" or native hypervisor. Examples of hypervisors useful for such purposes include Xen, Hyper-V®, and the like. Hypervisors typically run at a higher, more privileged processor state than any other software on the machine, and provide services such as memory management and processor scheduling for dependent layers and/or domains. The most privileged of such layers and/or domains resides in the service domain layer, which may include a host domain 908 that may include an administrative operating system for configuring the operation and functionality of the hypervisor 906, as well as that of domains of lower privilege, such as the domains of the guest virtual machines 910, 912, 914 or other operating systems, which may be heterogeneous (i.e., running different operating systems than each other). The host domain 908 (e.g., the DOM-0) may have direct access to the hardware resources 904 of the host computing device 902 by way of the hypervisor 906, while the guest virtual machine domains 910, 912, 914 may not.

Figure 10:
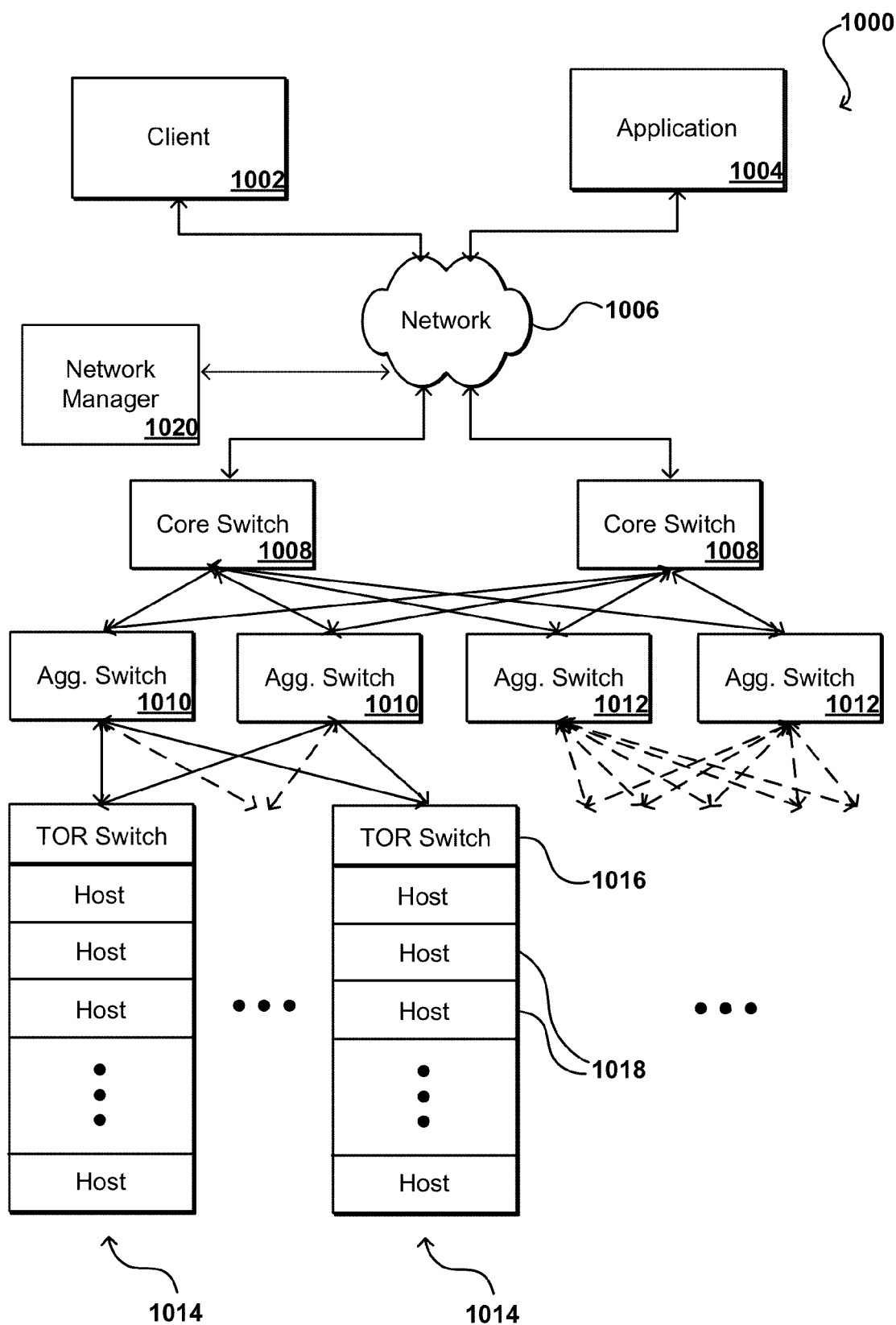
FIG. 10 illustrates components of an example environment in which aspects of the various embodiments can be implemented.

As mentioned, PCIe devices may be utilized in a shared resource environment, such as a data center or server farm. FIG. 10 illustrates an example network configuration 1000 that can be used to route communications between specific host machines or other such devices in such an environment. This example shows a typical design that can be used for a data center, wherein a source such as a client device 1002 or application 1004 is able to send requests across at least one network 1006, such as the Internet or a cellular network, to be received by one or more components of the data center. Properties of various components of the network, such as provisioned instances, etc., can be managed using at least one management system, component, or service 1020. In this example, the requests are received over the network to one of a plurality of core switches 1008, but it should be understood that there can be any of a number of other components between the network and the core switches as known in the art. As traditional differentiators have substantially disappeared, the terms "switch" and "router" can be used interchangeably. For purposes of clarity and explanation this document standardizes on the term "switch," but it should be understood this term as used also encompasses routers and other devices or components used for such purposes. Further, the switches can include any appropriate switch, such as a multilayer switch that operates at different levels in an OSI (Open System Interconnection) reference model.

As illustrated, each core switch 1008 is able to communicate with each of a plurality of aggregation switches 1010, 1012, which in at least some embodiments are utilized in pairs. Utilizing aggregation switches in pairs provides a redundant capability in case one or the switches experiences a failure or is otherwise unavailable, such that the other device can route traffic for the connected devices. As can be seen, each core switch in this example is connected to each aggregation switch, such that the tiers in this example are fully connected. Each pair of aggregation switches 1010, 1012 is linked to a plurality of physical racks 1014, each of which typically contains a top of rack (TOR) or "access" switch 1016 and a plurality of physical host machines 1018, such as data servers and other processing devices. As shown, each aggregation switch can be connected to a number of different racks, each with a number of host machines. For the respective portion of the network, the aggregation pairs are also fully connected to the TOR switches.

As an additional benefit, the use of aggregation switch pairs enables the capability of a link to be exceeded during peak periods, for example, wherein both aggregation switches can concurrently handle and route traffic. Each pair of aggregation switches can service a dedicated number of racks, such as one hundred twenty racks, based on factors such as capacity, number of ports, etc. There can be any appropriate number of aggregation switches in a data center, such as six aggregation pairs. The traffic from the aggregation pairs can be aggregated by the core switches, which can pass the traffic "up and out" of the data center, such as back across the network 1006. In some embodiments, the core switches are provided in pairs as well, for purposes including redundancy.

In some embodiments, such as high radix interconnection networks utilized for high-performance computing (HPC) or other such purposes, each physical rack can contain multiple switches. Instead of a single physical TOR switch connecting twenty-one hosts in a rack, for example, each of three switches in the rack can act as a local TOR switch for a "logical" rack (a sub-rack of a physical rack or logical grouping of devices (hosts and/or switches) from multiple racks), with each local TOR switch connecting seven of the host machines. The logical racks can be implemented using physical or wireless switches in different embodiments. In some embodiments each of these switches within a high performance computing rack manages up to twelve servers, but the number can vary depending on factors such as the number of ports on each switch. For example, if a switch contains twenty-four ports, half of those ports typically will be host-facing and the other half will face the external network. A design in accordance with one embodiment could utilize seven racks with three switches in each, with each switch communicating (redundantly) with twelve servers, which would generally be equivalent to twenty-one separate racks each with a single TOR switch communicating with twelve servers, for example. In subsequent figures and description, it should be understood that physical or logical racks can be used within the scope of the various embodiments.

Figure 11:
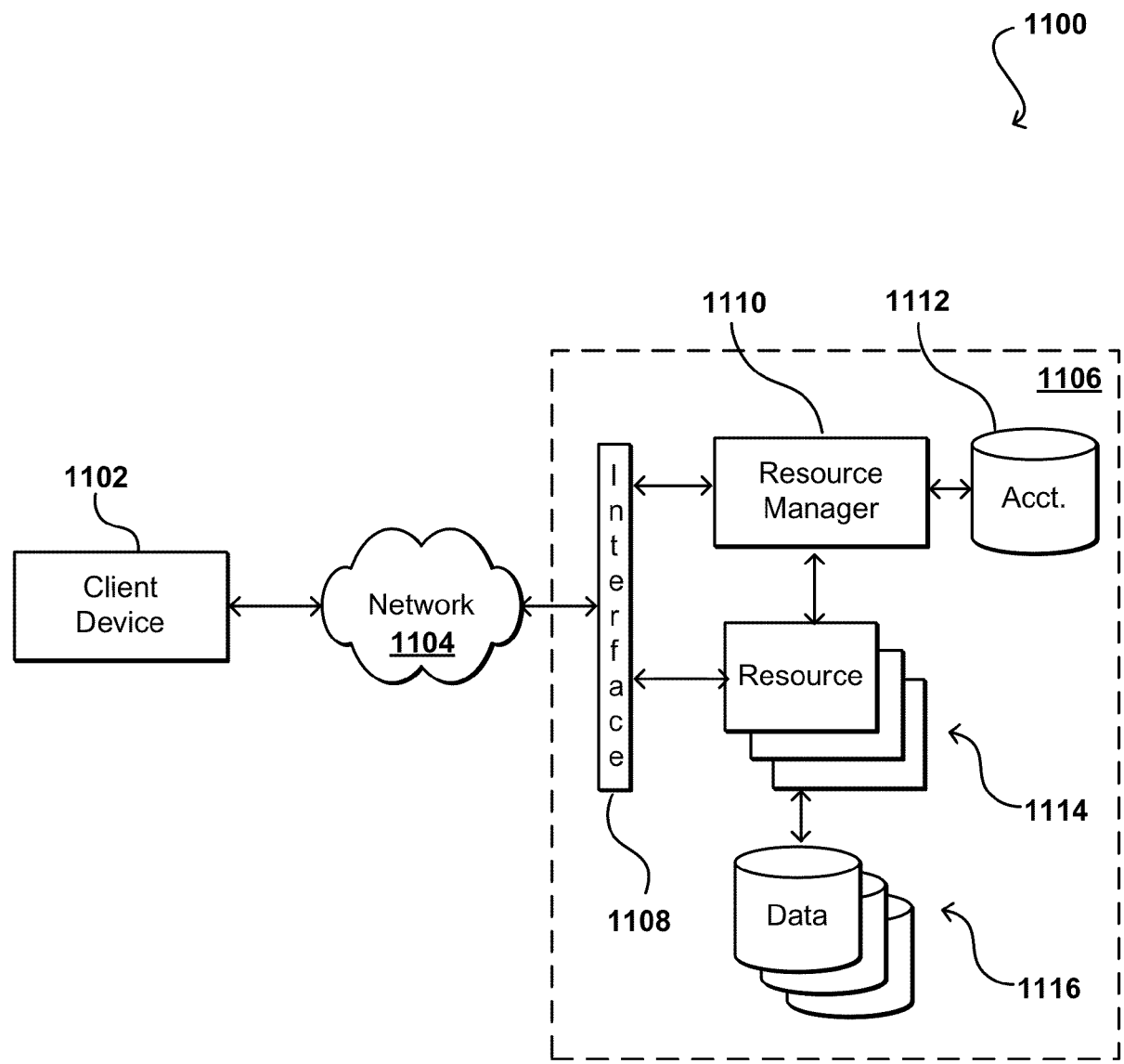
FIG. 11 illustrates components of another example environment that can be used to implement aspects of the various embodiments.

As mentioned, such a configuration can be used in some embodiments to provide resource capacity for one or more users or customers as part of a shared resource environment. FIG. 11 illustrates an example of one such environment 1100 in which aspects of the various embodiments can be implemented. In this example a user is able to utilize a client device 1102 to submit requests across at least one network 1104 to a multi-tenant resource provider environment 1106. The client device can include any appropriate electronic device operable to send and receive requests, messages, or other such information over an appropriate network and convey information back to a user of the device. Examples of such client devices include personal computers, tablet computers, smart phones, notebook computers, and the like. The at least one network 1104 can include any appropriate network, including an intranet, the Internet, a cellular network, a local area network (LAN), or any other such network or combination, and communication over the network can be enabled via wired and/or wireless connections. The resource provider environment 1106 can include any appropriate components for receiving requests and returning information or performing actions in response to those requests. As an example, the provider environment might include Web servers and/or application servers for receiving and processing requests, then returning data, Web pages, video, audio, or other such content or information in response to the request.

In various embodiments, the provider environment may include various types of resources that can be utilized by multiple users for a variety of different purposes. As used herein, computing and other electronic resources utilized in a network environment can be referred to as "network resources." These can include, for example, servers, databases, load balancers, routers, and the like, which can perform tasks such as to receive, transmit, and/or process data and/or executable instructions. In at least some embodiments, all or a portion of a given resource or set of resources might be allocated to a particular user or allocated for a particular task, for at least a determined period of time. The sharing of these multi-tenant resources from a provider environment is often referred to as resource sharing, Web services, or "cloud computing," among other such terms and depending upon the specific environment and/or implementation. In this example the provider environment includes a plurality of resources 1114 of one or more types. These types can include, for example, application servers operable to process instructions provided by a user or database servers operable to process data stored in one or more data stores 1116 in response to a user request. As known for such purposes, the user can also reserve at least a portion of the data storage in a given data store. Methods for enabling a user to reserve various resources and resource instances are well known in the art, such that detailed description of the entire process, and explanation of all possible components, will not be discussed in detail herein.

In at least some embodiments, a user wanting to utilize a portion of the resources 1114 can submit a request that is received to an interface layer 1108 of the provider environment 1106. The interface layer can include application programming interfaces (APIs) or other exposed interfaces enabling a user to submit requests to the provider environment. The interface layer 1108 in this example can also include other components as well, such as at least one Web server, routing components, load balancers, and the like. When a request to provision a resource is received to the interface layer 1108, information for the request can be directed to a resource manager 1110 or other such system, service, or component configured to manage user accounts and information, resource provisioning and usage, and other such aspects. A resource manager 1110 receiving the request can perform tasks such as to authenticate an identity of the user submitting the request, as well as to determine whether that user has an existing account with the resource provider, where the account data may be stored in at least one data store 1112 in the provider environment. A user can provide any of various types of credentials in order to authenticate an identity of the user to the provider. These credentials can include, for example, a username and password pair, biometric data, a digital signature, or other such information. The provider can validate this information against information stored for the user. If the user has an account with the appropriate permissions, status, etc., the resource manager can determine whether there are adequate resources available to suit the user's request, and if so can provision the resources or otherwise grant access to the corresponding portion of those resources for use by the user for an amount specified by the request. This amount can include, for example, capacity to process a single request or perform a single task, a specified period of time, or a recurring/renewable period, among other such values. If the user does not have a valid account with the provider, the user account does not enable access to the type of resources specified in the request, or another such reason is preventing the user from obtaining access to such resources, a communication can be sent to the user to enable the user to create or modify an account, or change the resources specified in the request, among other such options.

Once the user is authenticated, the account verified, and the resources allocated, the user can utilize the allocated resource(s) for the specified capacity, amount of data transfer, period of time, or other such value. In at least some embodiments, a user might provide a session token or other such credentials with subsequent requests in order to enable those requests to be processed on that user session. The user can receive a resource identifier, specific address, or other such information that can enable the client device 1102 to communicate with an allocated resource without having to communicate with the resource manager 1110, at least until such time as a relevant aspect of the user account changes, the user is no longer granted access to the resource, or another such aspect changes.

The resource manager 1110 (or another such system or service) in this example can also function as a virtual layer of hardware and software components that handles control functions in addition to management actions, as may include provisioning, scaling, replication, etc. The resource manager can utilize dedicated APIs in the interface layer 1108, where each API can be provided to receive requests for at least one specific action to be performed with respect to the data environment, such as to provision, scale, clone, or hibernate an instance. Upon receiving a request to one of the APIs, a Web services portion of the interface layer can parse or otherwise analyze the request to determine the steps or actions needed to act on or process the call. For example, a Web service call might be received that includes a request to create a data repository.

An interface layer 1108 in at least one embodiment includes a scalable set of user-facing servers that can provide the various APIs and return the appropriate responses based on the API specifications. The interface layer also can include at least one API service layer that in one embodiment consists of stateless, replicated servers which process the externally-facing user APIs. The interface layer can be responsible for Web service front end features such as authenticating users based on credentials, authorizing the user, throttling user requests to the API servers, validating user input, and marshalling or unmarshalling requests and responses. The API layer also can be responsible for reading and writing database configuration data to/from the administration data store, in response to the API calls. In many embodiments, the Web services layer and/or API service layer will be the only externally visible component, or the only component that is visible to, and accessible by, users of the control service. The servers of the Web services layer can be stateless and scaled horizontally as known in the art. API servers, as well as the persistent data store, can be spread across multiple data centers in a region, for example, such that the servers are resilient to single data center failures.

The various embodiments can be further implemented in a wide variety of operating environments, which in some cases can include one or more user computers or computing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially-available operating systems and other known applications for purposes such as development and database management. These devices can also include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as TCP/IP, FTP, UPnP, NFS, and CIFS. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more Web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, and IBM® as well as open-source servers such as MySQL, Postgres, SQLite, MongoDB, and any other server capable of storing, retrieving and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, magnetic tape drives, optical storage devices and solid-state storage devices such as random access memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. Additionally, if a particular decision or action is described as being made or performed "based on" a condition or piece of information, this should not be interpreted as that decision or action being made or performed exclusively based on that condition or piece of information, unless explicitly so stated.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A computer-implemented method, comprising:
receiving a first request to perform a first write operation for a first virtual machine on a host device, the first request formatted according to a peripheral component interconnect express (PCIe) protocol and generated by a PCIe device, wherein a header of the first request includes a first identifier for a first virtual function of the PCIe device corresponding to the first virtual machine, and wherein write operations from the host device are subject to PCIe ordering enforcement;
causing the first write operation to be performed for the first virtual function;
receiving a second request to perform a second write operation for a second virtual machine on the host device, the second request formatted according to the PCIe protocol and generated by the PCIe device, wherein a header of the second request includes a second identifier for a second virtual function of the PCIe device corresponding to the second virtual machine;
determining, based upon the first identifier and the second identifier, that the second request is associated with a separate ordering domain than the first request; and
causing the second write operation to be performed for the host device independent of prior completion of the first write operation on the host device, wherein performance of the second write operation bypasses the PCIe ordering enforcement.

2. The computer-implemented method of claim 1, further comprising:
determining, using header information for the second request, that ordering is to be enforced for the second request.

3. The computer-implemented method of claim 1, wherein an additional request from the second virtual function to the second virtual machine is performed independent of prior completion of the first write operation, the additional request relating to a read from the host device, or a read completion for the host device.

4. The computer-implemented method of claim 1, further comprising:
translating a packet for the second request from the PCIe protocol to an Advanced eXtensible Interface (AXI) interconnect protocol.

5. The computer-implemented method of claim 1, further comprising:
causing packets for the second request to take a different path through a PCIe communication fabric than packets for the second request based upon the first identifier being different from the second identifier.

6. A computer-implemented method, comprising:
receiving a packet for a write operation to be performed with respect to a virtual machine on a host device, the packet formatted according to a peripheral component interconnect express (PCIe) protocol and generated by a PCIe device, wherein a header of the packet includes an identifier for a virtual function of the PCIe device corresponding to the virtual machine, and the write operation of a type subject to PCIe ordering enforcement;
determining, based upon destination information that comprises at least an address and the identifier stored in the header of the packet, that the write operation is associated with a separate ordering domain than one or more prior write operations being performed on the host device, the destination information associated with one of a plurality of virtual machines executing on the host device, the plurality of virtual machines being in communication with virtual functions that are assigned respective identifiers comprising the identifier and that are associated with separate ordering domains; and
bypassing the PCIe ordering enforcement, based on the determination that the write operation is associated with the separate ordering domain than the one or more prior write operations, to enable the write operation before completion of the one or more prior write operations.

7. The computer-implemented method of claim 6, further comprising:
extracting information from the header of the packet.

8. The computer-implemented method of claim 6, further comprising:
determining a source and a destination for the write operation; and
storing the address and the identifier as the destination information for the source and the destination to the header of the packet.

9. The computer-implemented method of claim 6, wherein the respective identifiers that are assigned to the virtual functions are individual PCIe identifiers.

10. The computer-implemented method of claim 6, further comprising:
translating the packet for the write operation from the PCIe protocol to an Advanced eXtensible Interface (AXI) interconnect protocol.

11. The computer-implemented method of claim 6, further comprising:
setting a transaction identifier as the identifier and comprising a different value than a transaction value for a selected prior operation in order to cause the packet to take a different transmission path to the host device than a prior packet for the selected prior operation.

12. The computer-implemented method of claim 6, wherein packets from a single PCIe device are able to have PCIe ordering enforcement bypassed by specifying different transactions using the assigned respective identifiers for the packets.

13. A system, comprising:
a processor; and
memory including instructions that, when executed by the processor, cause the system to:
receive a packet for a write operation to be performed with respect to a virtual machine on a host device, the packet formatted according to a peripheral component interconnect express (PCIe) protocol and generated by a PCIe device, wherein a header of the packet includes an identifier for a virtual function of the PCIe device corresponding to the virtual machine, and the write operation of a type subject to PCIe ordering enforcement;
determine, based at least in part upon destination information that comprises at least an address and the identifier stored in the header of the packet, that the write operation is associated with a separate ordering domain than one or more prior write operations being performed on the host device, the destination information associated with one of a plurality of virtual machines executing on the host device the plurality of virtual machines being in communication with virtual functions that are assigned respective identifiers comprising the identifier and that are associated with separate ordering domains; and bypass the PCIe ordering enforcement, based on the determination that the write operation is associated with the separate ordering domain than the one or more prior write operations, to enable the write operation before completion of the one or more prior write operations.

14. The system of claim 13, wherein the instructions when executed further cause the system to:

extract information from the header of the packet.

15. The system of claim 13, wherein the instructions when executed further cause the system to:

determine a source and a destination for the write operation; and store the address and the identifier as the destination information for the source and the destination to the header of the packet.

16. The system of claim 13, wherein the instructions when executed further cause the system to:

translate the packet for the write operation from the PCIe protocol to an Advanced eXtensible Interface (AXI) interconnect protocol.

17. The system of claim 13, wherein the instructions when executed further cause the system to:

set a transaction identifier as the identifier and comprising a different value than a transaction value for a selected prior operation in order to cause the packet to take a different transmission path to the host device than a packet for the selected prior operation.

18. The system of claim 13, wherein packets from a single PCIe device are able to have PCIe ordering enforcement bypassed by specifying different transaction using the assigned respective identifiers for the packets.

19. The computer-implemented method of claim 6, further comprising:

causing packets for subsequent data operations to take a different path through a PCIe communication fabric than packets for the write operation based upon identifiers for the packets associated with the subsequent data operation being different from the identifier associated with the write operation.

20. The system of claim 13, wherein the instructions when executed further cause the system to:

cause packets for subsequent data operations to take a different path through a PCIe communication fabric than packets for the write operation based upon identifiers for the packets associated with the subsequent data operation being different from the identifier associated with the write operation.

\* \* \* \* \*